United States Patent [19]

Falster

[11] Patent Number: 5,593,494
[45] Date of Patent: Jan. 14, 1997

[54] PRECISION CONTROLLED PRECIPITATION OF OXYGEN IN SILICON

[75] Inventor: Robert Falster, Milan, Italy

[73] Assignee: MEMC Electronic Materials, Inc., St. Peters, Mo.

[21] Appl. No.: 403,301

[22] Filed: Mar. 14, 1995

[51] Int. Cl.$^6$ ..................................................... C30B 1/02
[52] U.S. Cl. ........................ 117/2; 117/4; 117/5; 117/20; 117/930
[58] Field of Search .................... 117/2, 4, 5, 20, 117/930

[56] References Cited

U.S. PATENT DOCUMENTS

| | | | |
|---|---|---|---|
| 4,437,922 | 3/1984 | Bischoff et al. | 156/603 |
| 4,474,641 | 10/1984 | van Run | 117/20 |
| 4,622,082 | 11/1986 | Dyson et al. | 148/33 |
| 4,809,196 | 2/1989 | Miller | 364/550.01 |
| 4,851,358 | 7/1989 | Huber | 437/10 |
| 5,096,839 | 3/1992 | Amai et al. | 437/10 |
| 5,110,404 | 5/1992 | Fusegawa et al. | 156/603 |
| 5,131,974 | 7/1992 | Oda et al. | 117/20 |
| 5,286,658 | 2/1994 | Shirakawa et al. | 437/10 |
| 5,385,115 | 1/1995 | Tomioka et al. | 117/2 |
| 5,403,406 | 4/1995 | Falster et al. | 117/2 |

FOREIGN PATENT DOCUMENTS

| | | |
|---|---|---|
| 090320 | 10/1983 | European Pat. Off. . |
| 098406 | 1/1984 | European Pat. Off. . |
| 390672 | 10/1990 | European Pat. Off. . |
| 536958 | 4/1993 | European Pat. Off. . |
| 04124094 | 4/1992 | Japan ..................................... 117/20 |
| 2080780 | 2/1982 | United Kingdom ........................ 117/2 |

*Primary Examiner*—Robert Kunemund
*Attorney, Agent, or Firm*—Senniger, Powers, Leavitt & Roedel

[57] ABSTRACT

Process for controlling the density of oxygen precipitate nucleation centers in single crystal silicon. In the process, the single crystal silicon is annealed at a temperature of at least about 350° C. to cause the formation of oxygen precipitate nucleation centers in the single crystal silicon. During the annealing step, the single crystal silicon is heated (or cooled) to achieve a first temperature, $T_1$, which is between about 350° C. and about 500° C. The temperature is then increased from $T_1$ to a second temperature, $T_2$, which is between about 500° C. and about 750° C. with the average rate of temperature increase from $T_1$ to $T_2$ being less than about 25° C. per minute. The annealing is terminated at a point in time when the oxygen precipitate nucleation centers are capable of being dissolved by heat-treating the silicon at a temperature not in excess of about 1150° C.

33 Claims, 3 Drawing Sheets

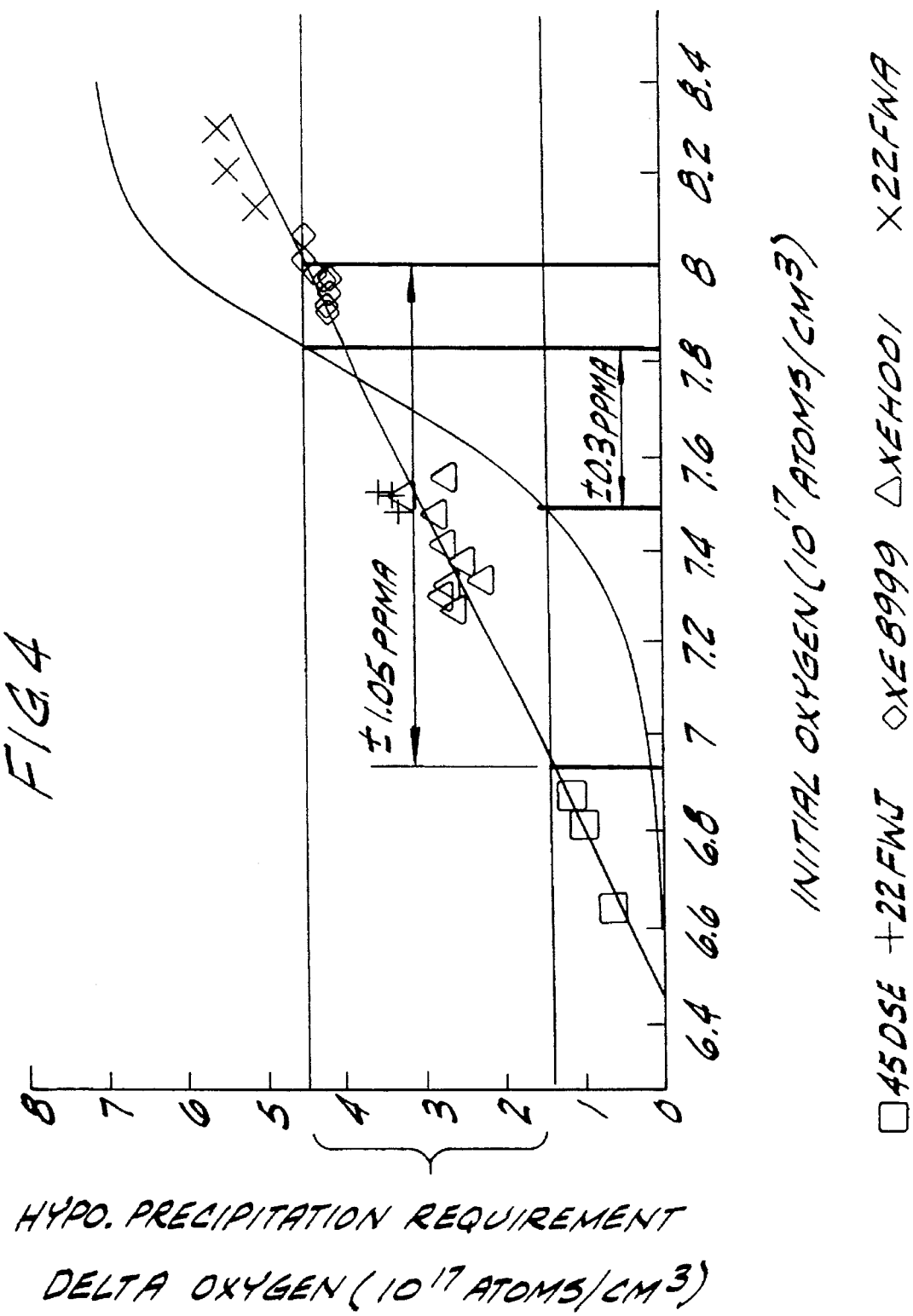

5,593,494

PRECISION CONTROLLED PRECIPITATION OF OXYGEN IN SILICON

BACKGROUND OF THE INVENTION

The present invention relates generally to the fabrication of single crystal silicon substrates, and more particularly, to a process for fabricating single crystal silicon wafers having oxygen precipitate nucleation centers which can be stabilized and serve as a site for the growth of oxygen precipitates with the number of oxygen precipitates having a low order of dependance upon the oxygen concentration of the single crystal silicon.

Single crystal silicon, which is the starting material for most processes for the fabrication of semiconductor electronic components, is commonly prepared with the so-called Czochralski ("Cz") process wherein a single seed crystal is immersed into molten silicon and then grown by slow extraction. At the temperature of the silicon molten mass, oxygen comes into the crystal lattice from the quartz crucible in which it is held until it reaches a concentration determined by the solubility of oxygen in silicon at the temperature of the molten mass and by the actual segregation coefficient of oxygen in solidified silicon. Such concentrations are greater than the solubility of oxygen in solid silicon at the temperatures typical for the processes for the fabrication of integrated circuits. As the crystal grows from the molten mass and cools, therefore, the solubility of oxygen in it decreases rapidly, whereby in the resulting slices or wafers, oxygen is present in supersaturated concentrations.

Thermal treatment cycles which are typically employed in the fabrication of electronic devices can cause the precipitation of oxygen in silicon wafers which are supersaturated in oxygen. Depending upon their location in the wafer, the precipitates can be harmful or beneficial. Oxygen precipitates located in the active device region of the wafer can impair the operation of the device. Oxygen precipitates located in the bulk of the wafer, however, are capable of trapping undesired metal impurities that may come into contact with the wafer. The use of oxygen precipitates located in the bulk of the wafer to trap metals is commonly referred to internal or intrinsic gettering ("IG").

Because of the problems associated with oxygen precipitates in the active device region, electronic device fabricators must use silicon wafers which are incapable of forming oxygen precipitates anywhere in the wafer under their process conditions, or alternatively, wafers which only form oxygen precipitates in the bulk of the wafer under their process conditions. Many electronic device fabricators prefer the latter alternative in view of the benefits of IG.

In general, the electronic device fabrication process inherently includes a series of steps which, in principle, can be used to form a zone near the surface of the wafer which is free of oxygen precipitates (commonly referred to as a "denuded zone" or a "precipitate free zone") with the balance of the wafer containing a sufficient number of oxygen precipitates for IG purposes. Denuded zones can be formed, for example, in a high-low-high thermal sequence such as (a) oxygen outdiffusion heat treatment at a high temperature (>1100° C.) in an inert ambient for a period of at least about 4 hours, (b) oxygen precipitate nuclei formation at a low temperature (600°–750° C.), and (c) growth of oxygen ($SiO_2$) precipitates at a high temperature (1000°–1150° C.). See, e.g., F. Shimura, *Semiconductor Silicon Crystal Technology*, Academic Press, Inc., San Diego Calif. (1989) at pages 361–367 and the references cited therein.

A critical requirement for many electronic device fabricators is that all wafers subjected to their thermal sequence have a uniform and reproducible denuded zone and a uniform and reproducible number density of oxygen precipitates outside the denuded zone. Uniformity and reproducibility have been difficult to achieve at a reasonable cost, however. There are several parameters which affect the density of oxide precipitates which develop in a given silicon wafer in a given IC manufacturing process, including: (1) the concentration of interstitial oxygen, $[O_i]_i$ present initially in solid solution, (2) the density of pre-existing (to the IC manufacturing process) oxygen clusters which act as nucleation sites for the precipitation of supersaturated oxygen, (3) the stability of these pre-existing clusters at higher temperatures, and (4) the details of the thermal cycles employed to produce the electronic device. These parameters can vary significantly from one wafer to the next.

One approach which has been tried to control the range in the concentration of oxygen precipitates formed during an IC manufacturing process is to narrow the range of oxygen concentration for the wafers. For example, many IC fabricators require that the range on oxygen concentration be within 1 ppma of a target value, or even less. This approach, however, stretches technological capability, reduces the flexibility of crystal growers to control other parameters and increases costs. Even worse, tightening oxygen concentration specifications does not guarantee success; thermal histories of the silicon wafers can have a profound effect upon the oxygen precipitation behavior. Thus, wafers having the same oxygen concentrations but different thermal histories can exhibit significantly different precipitate densities.

In view of the fact that tightening oxygen concentration specifications by itself will not lead to a narrow range of oxygen precipitate densities, some have attempted sorting wafers by oxygen concentration or other criteria from which values of oxygen precipitation values can be predicted. See, for example, Miller U.S. Pat. No. 4,809,196. Wafer-to-wafer uniformity with respect to oxygen precipitation is improved by this approach, but flexibility is significantly impaired and costs are increased.

Bischoff et al. suggest a process for forming wafers having a wide denuded zone ($\geq 15$ μm) with a high precipitate density ($>10^{12}/cm^3$) in U.S. Pat. No. 4,437,922. In their process, the denuded zone is formed first by annealing the wafers at 1100° C. for four hours. After the denuded zone is formed, Bischoff et al. suggest that the wafers be annealed at temperature in the range of 400° to 500° C. to nucleate a high density of very small precipitates and grow them to such a size to permit survival of a subsequent heat treatment such as 925° C. Thereafter, Bischoff et al. suggest heating the wafers at a rate of less than 2° C. per minute to a temperature between 750° C. and 1000° C. and annealing the wafers at this temperature for a period which is sufficient to ensure the survival of the precipitates in subsequent processing.

A significant disadvantage of the Bischoff et al. process is its failure to take advantage of the high temperature steps which are routinely used in electronic device fabrication. These steps could be used to form the denuded zone and to stabilize the oxygen precipitates in the balance of the wafer, provided the precipitation behavior were tailored for the specific electronic device fabrication process. The additional steps required by Bischoff et al. add significant labor and cost to the wafers. Furthermore, nowhere do Bischoff et al.

disclose any means for controlling the number density of the oxygen precipitates; Bischoff et al. merely disclosed how to consistently obtain a high density (>$10^{12}$/cm$^3$) which may not be appropriate for many applications.

SUMMARY OF THE INVENTION

Among the objects of the invention, therefore, is the provision of a process for providing sets of single crystal silicon wafers which have been assembled without resort to sorting by oxygen concentration or thermal history and which, as a group, exhibit highly uniform precipitation behavior; the provision of such a process in which the resulting wafers contain a substantially uniform distribution of oxygen clusters which, upon subsequent processing, can be dissolved to form a denuded zone in the region near the surface of the wafer and can be stabilized and serve as a site for the growth of oxygen precipitates in regions outside the denuded zone; and the provision of such a process in which the effective oxygen concentration dependence of the precipitation of oxygen in single crystal silicon is reduced.

Briefly, therefore, the present invention is directed to a process for controlling the density of oxygen precipitate nucleation centers in single crystal silicon. The process comprises annealing the single crystal silicon at temperatures of at least about 350° C. The annealing comprises (i) heat-treating the single crystal silicon at a temperature, $T_1$, between about 350° C. and about 500° C. to form oxygen precipitate nucleation centers in the single crystal silicon and (ii) increasing the temperature of the single crystal silicon from $T_1$ to a second temperature, $T_2$, between about 500° C. and about 750° C. The rate of temperature increase from $T_1$ to $T_2$ is controlled such that the single crystal silicon, upon achieving $T_2$, contains oxygen precipitate nucleation clusters formed at $T_1$. The annealing is terminated at a point in time when the oxygen precipitate nucleation centers are capable of being dissolved by heat-treating the silicon at temperatures not in excess of about 1150° C.

The present invention is also directed to a process for controlling the concentration of oxygen precipitate nucleation centers in single crystal silicon in which the silicon is heat-treated to dissolve the oxygen precipitate nucleation centers which were formed in the silicon during the growth of the single crystal. The heat-treated single crystal silicon is then annealed at a temperature of at least about 350° C. to cause oxygen precipitate nucleation centers to be formed and then increased in size in the single crystal silicon with the annealing comprising (i) causing the single crystal silicon to achieve a first temperature, $T_1$, which is between about 350° C. and about 500° C., and (ii) increasing the temperature of the single crystal silicon from $T_1$ to a second temperature, $T_2$, which is between about 500° C. and about 750° C. The average rate of temperature increase from $T_1$ to $T_2$ is controlled such that at an intermediate temperature, $T_{int}$, between $T_1$ and $T_2$, the single crystal silicon contains a population of oxygen precipitate nucleation clusters at least some of which were present a temperature which is less than $T_{int}$ but greater than $T_1$ and which have increased in size through the addition of oxygen atoms when the temperature was increased to $T_{int}$.

The present invention is further directed to a process for controlling the concentration of oxygen precipitate nucleation centers in a set of at least 25 single crystal silicon wafers. Each of the wafers in the set has a carbon concentration of less than 5×$10^{16}$ atoms/cm$^3$. The wafers also have a concentration of oxygen falling within a range of oxygen concentrations for the set with the difference between the maximum and the minimum concentration in the range of oxygen concentrations for the wafers in the set being at least 5×$10^{16}$ atoms/cm$^3$. The process comprises the steps of (a) heating (or cooling) the single crystal silicon to achieve a first temperature, $T_1$, which is between about 350° C. and about 500° C. The temperature is then increased from $T_1$ to a second temperature, $T_2$, which is between about 500° C. and about 750° C. at an average rate of less than 25° C. per minute. In addition, the increase in temperature from $T_1$ to $T_2$ is controlled such that the wafers in the set will contain oxygen precipitates upon being subjected to an oxygen precipitation heat treatment with the ratio of the maximum density to the minimum density of oxygen precipitates for the wafers in the set being no more than about 30.

The present invention is further directed to a set of at least twenty-five single crystal silicon wafers each of which contains a substantially uniform oxygen concentration at distances greater than 3 microns from the surface of the wafers. In addition, the difference between the maximum and the minimum concentration of oxygen concentration for the wafers in the set is at least 5×$10^{16}$ atoms/cm$^3$. The wafers additionally contain oxygen precipitate nucleation centers in a density such that upon being subjected to an oxygen precipitation heat treatment, each of the wafers in the set will have a density of oxygen precipitates with the ratio of the maximum density to the minimum density of oxygen precipitates for the wafers in the set being no more than about 30.

Other objects and features of this invention will be in part apparent and in part pointed out hereinafter.

BRIEF DESCRIPTION OF THE DRAWINGS

FIG. 4 is a graph which presents FIG. 3 and the data generated in Example 2 in a different form as described in Example 3.

DETAILED DESCRIPTION OF THE PREFERRED EMBODIMENTS

Figure 1:
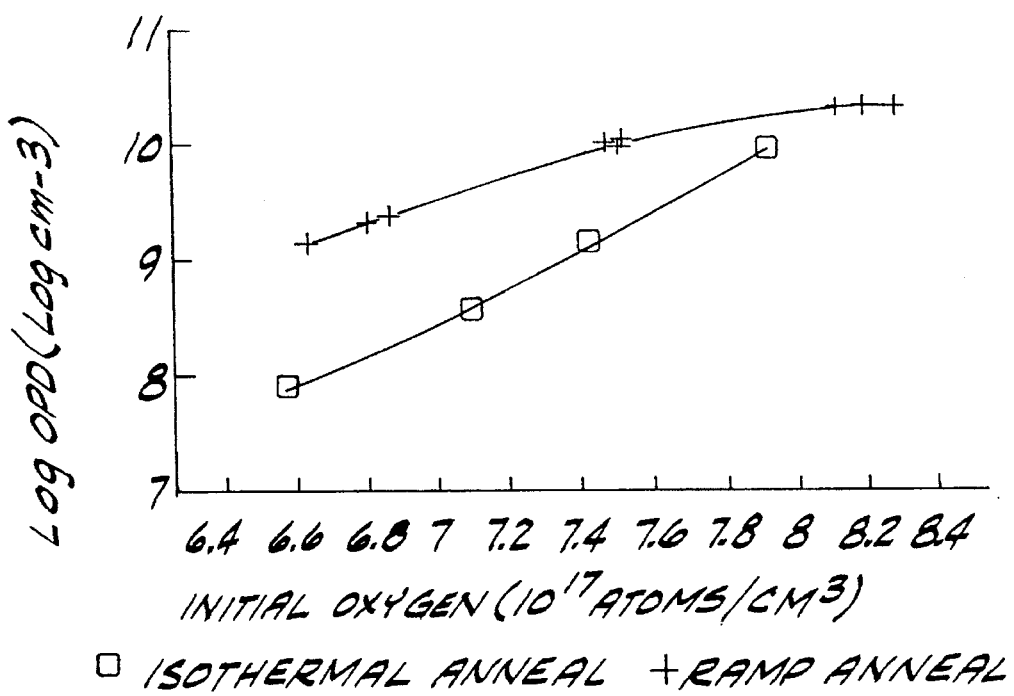
FIG. 1 is a graph of the log of the oxygen precipitate density ("OPD")/cm$^3$ versus the initial oxygen concentration (atoms/cm$^3$) for two sets of wafers subject to a series of heat treatments as set forth in Example 1.

Surprisingly, a process has been discovered for producing single crystal silicon having any target oxygen precipitate density within a wide range of oxygen precipitate densities from silicon having any of a wide range of oxygen concentrations. In general, the target precipitate density may fall anywhere within the range of about $10^7$ to about $10^{11}$ precipitates/cm$^3$ and the oxygen concentration of the silicon in which this target is achieved may fall anywhere within the range of about 6×$10^{17}$ to about 8.5×$10^{17}$ atoms/cm$^3$ (ASTM standard F-121-83), i.e., the range of oxygen concentration which is typical of Cz grown silicon.

The process of the present invention is designed to utilize the high temperature steps which are routinely used in electronic device fabrication. Single crystal silicon which has been prepared by the process of the present invention contains oxygen precipitate nucleation centers which have a low order of dependence upon oxygen concentration. When the silicon is subjected to such high temperature steps, the oxygen precipitate nucleation centers will dissolve in a region near the surface of the silicon to form a denuded zone whereas the oxygen precipitate nucleation centers in the bulk of the silicon will be stabilized and grown into oxygen precipitates, the number density of which is within a narrow range about a target density.

In accordance with the process of the present invention, a single crystal silicon starting material is subjected to an annealing treatment which is referred to herein as ramped annealing. In this ramped annealing sequence, the single crystal silicon is heated to a first temperature, $T_1$, and the temperature of the silicon is then increased to a second temperature, $T_2$, with the rate of temperature increase between $T_1$ and $T_2$ being controlled to maintain and grow oxygen precipitate nucleation centers which have been formed in the single crystal silicon during this process. The first temperature, $T_1$, is between about 350° C. and about 500° C., preferably between about 375° C. and about 475° C., and most preferably, between about 400° C. and about 450° C. The second temperature, $T_2$, is between about 500° C. and about 750° C., preferably between about 575° C. and about 725° C., more preferably, between about 600° C. and about 700° C., and most preferably, between about 600° C. and about 650° C.

The average rate at which the temperature of the silicon is increased between $T_1$ and $T_2$ will vary depending upon the oxygen concentration of the silicon, but typically will be between about 0.2° and about 25° C. per minute. In general, the rate of temperature increase decreases with decreasing oxygen concentration and thus, the average rate of temperature increase may be less than 10° C. per minute, 5° C. per minute, or even less than 1° C. per minute for silicon having less than about $7.2 \times 10^{17}$ oxygen atoms/cm$^3$ (as determined in accordance with ASTM Standard F-121-83). The manner in which temperature is increased as a function of time may be optimized for any given process; that is, it may be increased linearly or in steps as a function of time and at varying rates between the temperatures which are intermediate of $T_1$ and $T_2$.

The starting material for the process is single crystal silicon having a sufficient concentration of oxygen to enable its precipitation when subjected to an oxygen precipitation heat treatment. As previously noted, Czochralski grown silicon typically has an oxygen concentration of about $6 \times 10^{17}$ to about $8.5 \times 10^{17}$ atoms/cm$^3$ (ASTM standard F-121-83) which is sufficient for the precipitation of oxygen.

Oxygen can be precipitated from silicon, for example, by subjecting the silicon to a heat treatment which comprises annealing the silicon at a temperature in the range of about 650° C. to about 875° C., preferably between about 800° C. and 875° C. to stabilize oxygen precipitate nucleation centers present in the silicon and annealing the silicon at a temperature of at least about 1000° C. to precipitate oxygen at the site of the stabilized nucleation centers. The amount of time required to stabilize the nucleation centers is dependant upon the heat-treating temperature and, in general, less time is required to stabilize the nucleation centers as temperature is increased. For example, at least about six hours at a temperature of about 650° C. is required to stabilize the nucleation centers in silicon having an oxygen concentration of about $7.8 \times 10^{17}$ atoms/cm$^3$, whereas only about one-half hour is required to stabilize the nucleation centers at a temperature of about 800° C. A preferred heat treatment for precipitating oxygen comprises heating the wafers to 800° C. for four hours and then to 1000° C. for sixteen hours.

The single crystal silicon starting material should also have a low density of, and preferably, an essential absence of oxygen precipitate nucleation centers. The presence (or density) of these nucleation centers, however, cannot be directly measure using presently available techniques. As previously discussed, preexisting oxygen precipitate nucleation centers in the silicon can be stabilized and precipitates can be grown at these sites by subjecting the silicon to an oxygen precipitation heat treatment. Thus, the presence of these nucleation centers can indirectly be measured after an oxygen precipitation heat treatment. The detection limit for oxygen precipitates is currently about $10^7$ precipitates/cm$^3$. As used herein, therefore, silicon having a low density of oxygen precipitate nucleation centers shall mean silicon which, upon being annealed at a temperature of 800° C. for four hours and then at a temperature of 1000° C. for sixteen hours, has less than about $10^8$ oxygen precipitates/cm$^3$. Similarly, silicon having an essential absence of oxygen precipitate nucleation centers shall mean silicon which, upon being annealed at a temperature of 800° C. for four hours and then at a temperature of 1000° C. for sixteen hours, has less than $10^7$ oxygen precipitates/cm$^3$. Preferably, the silicon has less than $5 \times 10^7$ oxygen precipitates/cm$^3$, and more preferably the silicon has less than $10^7$ oxygen precipitates/cm$^3$.

Oxygen precipitate nucleation centers typically form in silicon which is annealed at a temperature in the range of about 350° to about 750° C. The single crystal silicon starting material, therefore, may be silicon taken from "short" crystals, that is, silicon which has been grown in a Czochralski process until the seed end has cooled from the melting point of silicon (1410° C.) to about 750° C. after which the ingot is rapidly cooled. In this way, the time spent in the temperature range critical for nucleation center formation is kept to a minimum and the nucleation centers have inadequate time to form in the crystal puller.

Alternatively, and more preferably, the single crystal starting material is annealed to dissolve the oxygen precipitate nucleation centers which were formed during the growth of the single crystal. Provided they have not been subjected to a stabilizing heat-treatment, oxygen precipitate nucleation centers can be annealed out of silicon by rapidly heating the silicon to a temperature of at least about 875° C. and preferably continuing to increase the temperature to at least 1000° C. By the time the silicon reaches 1000° C., substantially all (e.g., >99%) of such defects have annealed out. It is important that the wafers be rapidly heated to these temperatures, i.e., that the rate of temperature increase be at least about 10° C. per minute and more preferably at least about 50° C. per minute. Otherwise, some or all of the oxygen precipitate nucleation centers may be stabilized by the heat-treatment. Equilibrium appears to be reached in relatively short periods of time, i.e., on the order of 1 minute. Accordingly, oxygen precipitate nucleation centers in the single crystal silicon starting material may be dissolved by annealing the silicon at a temperature of at least about 875° C. for a period of at least about 30 seconds, preferably at least about 10 minutes. The dissolution may be carried out in a conventional furnace or in a rapid thermal annealing (RTA) system. In addition, the dissolution may carried out on crystal ingots or on wafers.

Substitutional carbon, when present as an impurity in single crystal silicon has the ability to catalyze the formation of oxygen precipitate nucleation centers. For this and other reasons, therefore, it is preferred that the single crystal silicon starting material have a low concentration of carbon. That is, the single crystal silicon should have a concentration of carbon which is less than about $5 \times 10^{16}$ atoms/cm$^3$, preferably which is less than $1 \times 10^{16}$ atoms/cm$^3$, and more preferably less than $5 \times 10^{15}$ atoms/cm$^3$.

The single crystal silicon should also preferably have a substantially uniform oxygen concentration as a function of depth from the silicon surface. Unlike prior methods used to control the precipitation of oxygen in silicon, it is unnecessary to subject the single crystal silicon to a high temperature step to cause the outdiffusion of oxygen in regions near the surface of the silicon prior to the ramped annealing steps of the present invention. Such high temperature steps when carried out for the sole purpose of forming a denuded zone add significant cost to the silicon wafer. Thus, it is preferred that the single crystal silicon starting material for the ramped annealing sequence of steps have a uniform concentration of oxygen from the center of the silicon to regions of the wafer which are within 15 microns of the silicon surface, more preferably from the center of the silicon to regions of the wafer which are within 10 microns of the silicon surface, even more preferably from the center of the silicon to regions of the wafer which are within 5 microns of the silicon surface and most preferably from the center of the silicon to regions of the wafer which are within 3 microns of the silicon surface. In this context, substantially uniform oxygen concentration shall mean a variance in the oxygen concentration of no more than about 50%, preferably no more than about 20% and most preferably no more than about 10%.

When single crystal silicon starting material having a substantially uniform oxygen concentration is subjected to the ramped annealing sequence of the present invention, single crystal silicon having a corresponding uniform density of oxygen precipitate nucleation centers will be produced. That is, after ramped annealing the single crystal silicon will have a substantially uniform density of oxygen precipitate nucleation centers from the center of the silicon to regions of the wafer which are within 15 microns of the silicon surface, more preferably from the center of the silicon to regions of the wafer which are within 10 microns of the silicon surface, even more preferably from the center of the silicon to regions of the wafer which are within 5 microns of the silicon surface and most preferably from the center of the silicon to regions of the wafer which are within 3 microns of the silicon surface. In this context, substantially uniform density of oxygen precipitate nucleation centers shall mean a variance in the number density of no more than a factor of 10, preferably no more than a factor of 5 and most preferably no more than a factor of 2.

The ramped annealing process of the present invention is distinguishable from conventional isothermal annealing processes. In a conventional isothermal annealing process, the single crystal silicon is heated to a target temperature within the range of about 500° C. to about 650° C., annealed at that target temperature for a period of about fifteen minutes to several hours or more, and then cooled. During the annealing period, oxygen precipitate nucleation centers are formed. Based upon experience to date, a plot of the precipitate density versus initial oxygen concentration for a set of wafers which have been isothermally annealed will generally show an approximate dependence of $[O_i]^n$ where n is between about 25 and 30, provided the wafers have an essential absence of oxygen precipitate nucleation centers prior to the isothermal anneal.

If ramped annealing is used instead of isothermal annealing, however, the oxygen precipitate dependencies upon oxygen concentration of single crystal silicon can be significantly reduced. That is, the exponent "n" can be reduced to less than 25, preferably less than 20, more preferably less than 15 and optimally less than 10.

Without being bound to any theory, it is believed that the difference between ramped annealing and isothermal annealing can be explained on the basis of the effect of concentration and temperature upon the precipitation of oxygen. In general, the more solute atoms that are involved in a particular sized cluster, the stronger is the dependence on the concentration of the solute on the probability of its forming. To the first order, the nucleation rate at any one temperature for such a cluster goes as $[O_i]^x$ where x is the number of atoms in the cluster. Also, it takes more time to build larger cluster than smaller ones and the time it takes to build large clusters increases dramatically with decreasing temperature. Combining these observations about the oxygen dependence of small clusters and the time dependence of large cluster formation at low temperatures suggests that at low temperatures the population of oxygen clusters is completely dominated by clusters of the lowest order— clusters which have formed with a relatively weak dependence on the concentration of oxygen present in the crystal. Some or all of these type of clusters may be observable as "thermal donors."

The ramped annealing process of the present invention, begins with a relatively low first temperature, $T_1$, designed to create only very small clusters, that is, clusters which form with a relatively weak oxygen concentration dependence. The larger clusters which are necessary for the nucleation of oxide precipitation form as the temperature is slowly ramped up. Larger clusters grow by building preferentially on pre-existing smaller clusters which were formed with a relatively weak dependence on the oxygen concentration. If enough time is allowed for a sufficient quantity of very low order clusters to form and if the ramp up in temperature is done sufficiently slowly to avoid too much dissolution of these defects as temperature increases, the weak dependence on oxygen concentration at the first temperature, $T_1$, can be passed on to some extent to the larger defects. Stated another way, the rate of temperature increase from $T_1$ to $T_2$ is controlled such that at an intermediate temperature, $T_{int}$, between $T_1$ and $T_2$, the single crystal silicon contains a population of oxygen precipitate nucleation clusters at least some of which, preferably the majority of which, were present at a temperature which is less than $T_{int}$ but greater than $T_1$ and which increased in size through the addition of oxygen atoms when the temperature was increased to $T_{int}$ (the balance of the population of oxygen precipitate nucleation centers which are present at $T_{int}$ being spontaneously formed at each $T_{int}$).

The result of ramped annealing is a population of larger clusters which exist at each intermediate temperature, $T_{int}$, and ultimately at the second temperature, $T_2$, whose density dependence on oxygen concentration is greatly reduced as compared to isothermal annealing. Significantly, these clusters are not of such a great size that their survival in subsequent device processing is insured; they can be dissolved by subsequent thermal processing. As a result, wafers subjected to ramped annealing and thereafter to the high-low-high thermal process steps which typically occur in the fabrication of an electronic device will naturally and desirably form a denuded zone near the surface of the wafer and a target density of oxygen precipitates outside the denuded zone. In addition, the range of precipitation densities for a given oxygen content is readily adjustable with a wide variety of parameters which allow for the setting of both an average target value and the slope of the oxygen concentration dependence. These parameters are:
1) the first temperature, $T_1$;
2) the length of time for which $T_1$ is maintained;
3) the ramp rate to higher temperatures;
4) the second temperature, $T_2$; and
5) the length of time for which $T_2$ is maintained.

In general, the first temperature, $T_1$, is maintained for a period of one hour or less whereas the second temperature, $T_2$, is maintained for a period which is determined by the magnitude of the second temperature. If $T_2$ is between about 600° C. and 650° C., $T_2$ will typically be maintained for no more than four hours, preferably for no more than about two hours and more preferably for no more than about one hour. If $T_2$ is between about 650° C. and 700° C., $T_2$ will typically be maintained for no more than two hours, preferably for no more than about one hour and more preferably for no more than about one-half hour. If $T_2$ is between about 700° C. and 750° C., $T_2$ will typically be maintained for no more than one hour, preferably for no more than about one-half hour and more preferably for no more than about one-quarter hour.

As previously noted, the average ramp rate between $T_1$ and $T_2$ will be between about 0.2° C. and 25° C. per minute. Importantly, the ramp between any two temperatures in the temperature range of $T_1$ to $T_2$ should be controlled to maintain and grow oxygen precipitate nucleation centers which existed at a lesser temperature.

After the single crystal silicon is subjected to ramped annealing, it is important that the silicon not be subjected to a heat-treatment which stabilizes oxygen precipitation nucleation centers prior to a heat-treatment which causes the formation of a denuded zone. Otherwise, the oxygen clusters (oxygen precipitate nucleation centers) which were nucleated and grown during the ramped annealing step would be stabilized substantially throughout the entire thickness of the silicon and effectively prevent the formation of a denuded zone during a subsequent electronic device fabrication process.

It is worth emphasizing that oxygen precipitate nucleation centers formed in single crystal silicon by ramped annealing in accordance with the present invention are capable of being dissolved. As a result, the nucleation centers in the region near the surface of the wafer can be dissolved to form a denuded zone during a thermal processing step which is a natural and inherent part of an electronic device fabrication process. Outside this denuded zone, the oxygen precipitate centers can be stabilized and serve as the site for the growth of oxygen precipitates in later processing steps with the number density of the precipitates outside the denuded zone being within a relatively narrow range about a target value.

In addition, the number density of the precipitates outside the denuded zone for a set of wafers can be controlled to have a low order of dependence upon oxygen concentration. Advantageously, therefore, sets of wafers sliced from one or more crystal ingots grown by the Czochralski technique can be prepared which have a relatively narrow range of distribution about a target oxygen precipitate number density without resort to sorting based upon oxygen concentration or thermal history, or by requiring that the silicon contain unacceptably high carbon concentrations. For example, a set of wafers (e.g., at least 2 and preferably at least about 25–200 wafers) sliced from single crystal silicon grown by the Czochralski technique and subjected to ramped annealing and then to an oxygen precipitate stabilization and growth heat treatment can have an oxygen precipitate density within a narrow range about a target density which may be anywhere between about $10^7$ to about $10^{11}$ precipitates/cm$^3$. The distribution of the wafers in the set about this target density will be a function of the order of dependence upon oxygen concentration and the range of oxygen concentrations of the wafers in the set and can be mathematically expressed as $$\frac{OPD^T + \delta OPD^+}{OPD^T - \delta OPD^-} = \left( \frac{O_i^T + \delta O_i}{O_i^T - \delta O_i} \right)^m$$

wherein
$O_i^T$=initial oxygen concentration target value for a wafer population,
$O_i^T+\delta O_i$=upper limit to oxygen concentration in wafer population,
$O_i^T-\delta O_i$=lower limit to oxygen concentration in wafer population,
$OPD^T$=target precipitate density for the value of $O_i^T$,
$OPD^T+\delta OPD^+$=maximum oxygen precipitate density in population,
$OPD^T-\delta OPD^-$=minimum oxygen precipitate density in population, and $$\frac{OPD^T + \delta OPD^+}{OPD^T - \delta OPD^-} = \text{ratio of maximum to minimum precipitate values in a population of a given } O_i^T \pm \delta O_i \text{ (hereinafter the ``OPD max/min ratio'')}$$

In general, the ratio of maximum to minimum precipitate values in a population of wafers for a given $O_i^T \pm \delta O_i$ wherein $O_i^T$ is any value which can be achieved with Czochralski grown silicon and $\delta O_i$ is between about 0.5 ppma and 2 ppma will desirably be more than 100, preferably is less than 50, more preferably is less than 30, and for some applications, most preferably is less than 20, 15, 10 or even 5. Presented in Tables I–III are calculated values for the predicted maximum to minimum precipitate values in a population of wafers (hereinafter the "OPD max/min ratio") for selected orders of dependence upon oxygen concentration, target oxygen concentration, and ranges of oxygen concentration about the specified target, for the wafers in the population. The target oxygen concentration and range of oxygen concentrations is expressed in ppma with 1 ppma being equivalent to $5\times10^{16}$ atoms/cm$^3$.

TABLE I

| m | $O_i^T$ = 12 ppma $\delta O_i$ = 1 ppma OPD max/min ratios | $O_i^T$ = 13 ppma $\delta O_i$ = 1 ppma OPD max/min ratios | $O_i^T$ = 14 ppma $\delta O_i$ = 1 ppma OPD max/min ratios | $O_i^T$ = 15 ppma $\delta O_i$ = 1 ppma OPD max/min ratios | $O_i^T$ = 16 ppma $\delta O_i$ = 1 ppma OPD max/min ratios | $O_i^T$ = 17 ppma $\delta O_i$ = 1 ppma OPD max/min ratios |
|---|---|---|---|---|---|---|
| 10 | 5.32 | 4.67 | 4.18 | 3.80 | 3.50 | 3.25 |
| 15 | 12.25 | 10.10 | 8.55 | 7.41 | 6.54 | 5.85 |
| 20 | 28.25 | 21.82 | 17.50 | 14.45 | 12.22 | 10.55 |

TABLE I-continued

| m | $O_i^T$ = 12 ppma<br>$\delta O_i$ = 1 ppma<br>OPD max/min ratios | $O_i^T$ = 13 ppma<br>$\delta O_i$ = 1 ppma<br>OPD max/min ratios | $O_i^T$ = 14 ppma<br>$\delta O_i$ = 1 ppma<br>OPD max/min ratios | $O_i^T$ = 15 ppma<br>$\delta O_i$ = 1 ppma<br>OPD max/min ratios | $O_i^T$ = 16 ppma<br>$\delta O_i$ = 1 ppma<br>OPD max/min ratios | $O_i^T$ = 17 ppma<br>$\delta O_i$ = 1 ppma<br>OPD max/min ratios |
|---|---|---|---|---|---|---|
| 25 | 65.13 | 47.17 | 35.78 | 28.17 | 22.85 | 19.00 |
| 30 | 150.15 | 101.95 | 73.19 | 54.92 | 42.73 | 34.24 |

TABLE II

| m | $O_i^T$ = 12 ppma<br>$\delta O_i$ = 1.5 ppma<br>OPD max/min ratios | $O_i^T$ = 13 ppma<br>$\delta O_i$ = 1.5 ppma<br>OPD max/min ratios | $O_i^T$ = 14 ppma<br>$\delta O_i$ = 1.5 ppma<br>OPD max/min ratios | $O_i^T$ = 15 ppma<br>$\delta O_i$ = 1.5 ppma<br>OPD max/min ratios | $O_i^T$ = 16 ppma<br>$\delta O_i$ = 1.5 ppma<br>OPD max/min ratios | $O_i^T$ = 17 ppma<br>$\delta O_i$ = 1.5 ppma<br>OPD max/min ratios |
|---|---|---|---|---|---|---|
| 10 | 12.34 | 10.16 | 8.59 | 7.44 | 6.56 | 5.87 |
| 15 | 43.37 | 32.36 | 25.20 | 20.29 | 16.79 | 14.21 |
| 20 | 152.37 | 103.13 | 73.86 | 55.34 | 42.99 | 34.42 |
| 25 | 535.32 | 328.67 | 210.54 | 150.93 | 110.09 | 83.37 |
| 30 | 1880.76 | 1047.38 | 634.82 | 411.63 | 281.90 | 201.93 |

TABLE III

| m | $O_i^T$ = 12 ppma<br>$\delta O_i$ = 2 ppma<br>OPD max/min ratios | $O_i^T$ = 13 ppma<br>$\delta O_i$ = 2 ppma<br>OPD max/min ratios | $O_i^T$ = 14 ppma<br>$\delta O_i$ = 2 ppma<br>OPD max/min ratios | $O_i^T$ = 15 ppma<br>$\delta O_i$ = 2 ppma<br>OPD max/min ratios | $O_i^T$ = 16 ppma<br>$\delta O_i$ = 2 ppma<br>OPD max/min ratios | $O_i^T$ = 17 ppma<br>$\delta O_i$ = 2 ppma<br>OPD max/min ratios |
|---|---|---|---|---|---|---|
| 10 | 28.93 | 22.23 | 17.76 | 14.62 | 12.34 | 10.63 |
| 15 | 155.57 | 104.83 | 74.83 | 55.92 | 43.37 | 34.67 |
| 20 | 836.68 | 494.28 | 315.34 | 213.85 | 152.37 | 113.04 |
| 25 | 4499.88 | 2330.58 | 1328.83 | 817.79 | 535.32 | 368.60 |
| 30 | 24201.43 | 10988.98 | 5599.67 | 3127.28 | 1880.76 | 1201.91 |

Based upon the data presented in Tables I–III, therefore, sets of wafers having an oxygen concentration of 12±1 ppma, 13±1 ppma, 14±1 ppma, 15±1 ppma, 16±1 ppma, or 17±1 ppma may be prepared with the ratio of the maximum to minimum oxygen precipitate density for the wafers in the set being less than 50, 40, 30, 20, 15, 10 or even 5. Similarly, sets of wafers having an oxygen concentration of 12±1.5 ppma, 13±1.5 ppma, 14±1.5 ppma, 15±1.5 ppma, 16±1.5 ppma, or 17±1.5 ppma, may be prepared with the ratio of the maximum to minimum oxygen precipitate density for the wafers in the set being less than 100, 50, 40, 30, 20, 15, 10 or even 5. In addition, sets of wafers having an oxygen concentration of 12±2 ppma, 13±2 ppma, 14±2 ppma, 15±2 ppma, 16±2 ppma, or 17±2 ppma may be prepared with the ratio of the maximum to minimum oxygen precipitate density for the wafers in the set being less than 200, 150, 100, 50, 40, 30, 25, 15, 10 or even 5. These sets of wafers may be contained, for example, in wafer cassettes of the type in which wafers are typically stored and shipped, in boats of the type which are typically used for heat-treating silicon wafers, or in an equivalent wafer carrier.

The following examples will illustrate the invention.

EXAMPLE 1

Figure 2:
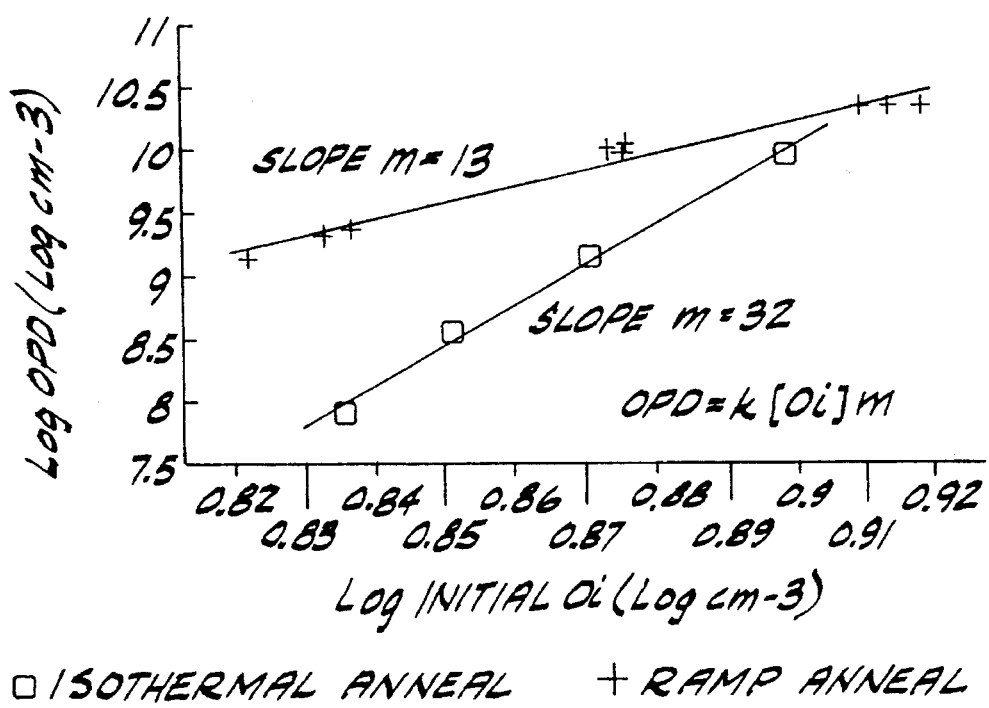
FIG. 2 is a graph of the log of the oxygen precipitate density ("OPD")/cm$^3$ versus the the log of the initial oxygen concentration (atoms/cm$^3$) for two sets of wafers, one subjected to an isothermal anneal and the other subjected to a ramp anneal as set forth in Example 1.

To demonstrate the difference between the ramped annealing process of the present invention and isothermal annealing, two groups of silicon wafers having a wide range of oxygen concentrations taken from the same crystals were treated. The wafers in both groups were heated to 1000° C. for 15 minutes to dissolve the oxygen precipitate nucleation clusters formed during the growth of the crystals. One of the groups was then isothermally annealed at 500° C. for 2 hours, and the other group was ramped annealed by heating the wafers to 450° C. for 30 minutes, increasing the temperature of the wafers at the rate 1° C. per minute until the wafers reached 650° C., and maintaining them at 650° C. for 15 minutes. Thereafter, the wafers in both groups were heated to 800° C. for 4 hours and then to 1000° C. for 16 hours to stabilize and grow oxygen precipitates (the "N1 treatment"). The results are presented in FIGS. 1 and 2.

The improvement of the ramped annealing treatment on the isothermal treatment is remarkable. The oxygen precipitate density ("OPD") of the isothermally annealed group shows an approximate 32th power dependence on initial oxygen concentration ("$O_i$") whereas the ramp annealed material shows only a 13th power dependence. An effect of this reduction is, for example, that a variation in precipitation within a ±1 ppma oxygen concentration is reduced from about two orders of magnitude to about a factor of 2, i.e., an improvement by a factor of 50.

EXAMPLE 2

Figure 3:
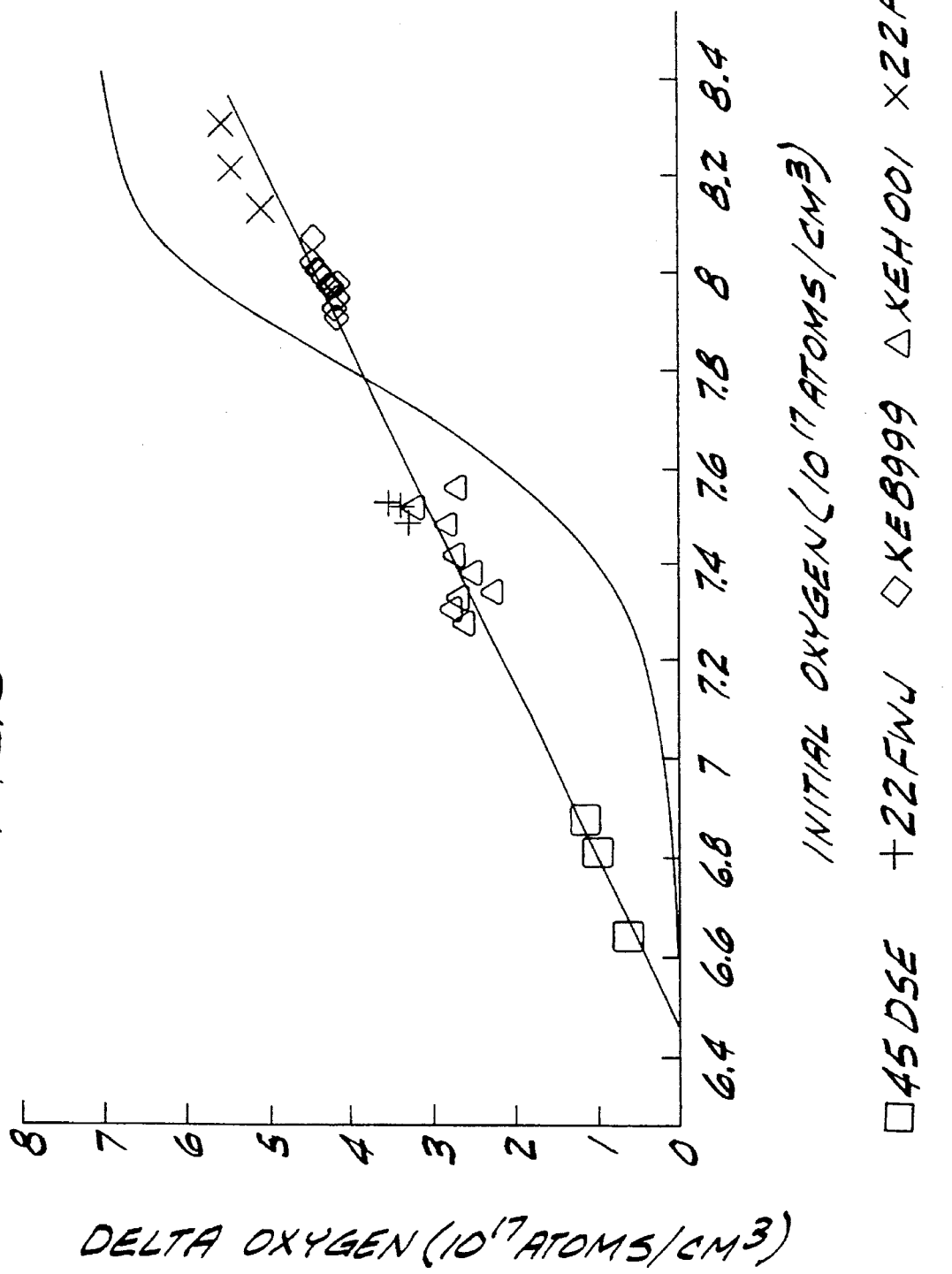
FIG. 3 is a graph of the change in oxygen concentration ("Delta Oxygen")/cm$^3$ versus the the log of the initial oxygen concentration (atoms/cm$^3$) for a set of wafers subjected to a ramp anneal and a curve showing what the relationship would have been if the wafers had been isothermally annealed instead, as set forth in Example 2.

The procedures of Example 1 were repeated except that three sets of wafers were sliced from three different crystals (45DSE, XE8999, and XEH001) and two sets of wafers were sliced from different portions of a fourth crystal (22FWJ, and 22FWA) and none of the wafers were subjected to an isothermal anneal. The change in oxygen concentration ("delta oxygen") as a result of this anneal as a function of the initial oxygen concentration is presented in FIG. 3. Also presented in FIG. 3 is a generally smooth, S-shaped curve which depicts what the change in oxygen concentration would be as a function of the initial oxygen concentration if the wafers had been isothermally annealed, the curve being based upon considerable prior experimental data. The improvement of ramped annealing over isothermal annealing is evident from this data.

EXAMPLE 3

Another way of illustrating the advantages of the invention using the data generated in Example 2 appears in FIG. 4. A hypothetical oxygen precipitation requirement of delta $[O_i]=1.5\times10^{17}$ to $4.5\times10^{17}$ cm$^3$ following the N1 treatment (see Example 1) was established. As the figure illustrates, such a specification could only be met in standard isothermal annealed material by using a first oxygen specification of ±0.3 ppma, which is practically infeasible with conventional crystal pulling technology. Using the ramped annealing approach, however, the same tight oxygen precipitation specification could be met with a first oxygen specification of ±1 ppma which is routinely achieved using conventional crystal pulling technology. For less stringent specifications on oxygen precipitation, the first oxygen concentration specification could even be widened beyond ±1 ppma and still achieve significantly better performance than the standard production methods currently used today.

Further refinements in the starting temperature, ramp rate, and second temperature relative to the conditions employed in Example 2 could result in further improvements such that, at least theoretically, the exponent of the oxygen concentration dependence could be reduce to such an extent that given the relatively narrow range of oxygen concentration which the Czochralski process is capable of giving, that the need to measure or even specify first oxygen concentration could become irrelevant. All material inside this range (all Cz material) would be effectively identical (and identically adjustable) in performance. As such, crystal growth processes could be designed and optimized, entirely ignoring the question of oxygen.

In view of the above, it will be seen that the several objects of the invention are achieved.

As various changes could be made in the above compositions and processes without departing from the scope of the invention, it is intended that all matter contained in the above description be interpreted as illustrative and not in a limiting sense.

What is claimed is:

1. A process for controlling the density of oxygen precipitate nucleation centers in single crystal silicon comprising the steps of:
   annealing the single crystal silicon at temperatures of at least about 350° C., the annealing comprising (i) heat-treating the single crystal silicon at a temperature, $T_1$, between about 350° C. and about 500° C. to form oxygen precipitate nucleation centers in the single crystal silicon and (ii) increasing the temperature of the single crystal silicon from $T_1$ to a second temperature, $T_2$, between about 500° C. and about 750° C., and (iii) controlling the rate of temperature increase from $T_1$ to $T_2$ such that the single crystal silicon, upon achieving $T_2$, contains oxygen precipitate nucleation clusters formed at $T_1$, and
   terminating said annealing at a point in time when the oxygen precipitate nucleation centers are capable of being dissolved by heat-treating the silicon at a temperature not in excess of about 1150° C.

2. The process of claim 1 wherein the single crystal silicon has a carbon concentration of less than $1\times10^{16}$ atoms/cm$^3$.

3. The process of claim 2 wherein the single crystal silicon is not heat-treated to form a denuded zone prior to said annealing step.

4. The process of claim 1 wherein the single crystal silicon is not heat-treated to form a denuded zone prior to said annealing step.

5. The process of claim 1 wherein $T_1$ is between about 375° C. and about 475° C. and $T_2$ is between about 575° C. and about 725° C.

6. The process of claim 1 wherein average rate of temperature increase from $T_1$ to $T_2$ is less than 25° C. per minute.

7. The process of claim 1 wherein average rate of temperature increase from $T_1$ to $T_2$ is less than 10° C. per minute.

8. The process of claim 1 wherein average rate of temperature increase from $T_1$ to $T_2$ is less than 5° C. per minute.

9. The process of claim 1 wherein average rate of temperature increase from $T_1$ to $T_2$ is less than 1° C. per minute.

10. A process for controlling the concentration of oxygen precipitate nucleation centers in single crystal silicon comprising the steps of:
    (a) heat-treating single crystal silicon which contains oxygen precipitate nucleation centers formed during the growth of the single crystal at a temperature of at least about 875° to dissolve the oxygen precipitate nucleation centers without forming a denuded zone, and
    (b) annealing the heat-treated single crystal silicon at a temperature of at least about 350° C. to cause oxygen precipitate nucleation centers to be formed and then increased in size in the single crystal silicon, the annealing comprising (i) causing the single crystal to achieve a first temperature, $T_1$, which is between about 350° C. and about 500° C., and (ii) increasing the temperature of the single crystal silicon from $T_1$ to a second temperature, $T_2$, which is between about 500° C. and about 750° C. with the average rate of temperature increase from $T_1$ to $T_2$ being controlled such that at each intermediate temperature, $T_{int}$, between $T_1$ and $T_2$, the single crystal silicon contains a population of oxygen precipitate nucleation clusters at least some of which were present a temperature which is less than $T_{int}$ but greater than $T_1$ and which have increased in size through the addition of oxygen atoms when the temperature was increased to $T_{int}$.

11. The process of claim 10 wherein the single crystal silicon has a carbon concentration of less than $1\times10^{16}$ atoms/cm$^3$.

12. The process of claim 10 wherein $T_1$ is between about 375° C. and about 475° C. and $T_2$ is between about 575° C. and about 725° C.

13. The process of claim 10 wherein average rate of temperature increase from $T_1$ to $T_2$ is less than 10° C. per minute.

14. A process for controlling the concentration of oxygen precipitate nucleation centers in a set of at least 25 single crystal silicon wafers each of which has a carbon concentration of less than $5\times10^{16}$ atoms/cm$^3$ and a concentration of oxygen falling within a range of oxygen concentrations defined by the set with the difference between the maximum and the minimum concentration in the range of oxygen concentrations for the wafers in the set being at least $5 \times 10^{16}$ atoms/cm$^3$, the process comprising causing the wafers to achieve a first temperature, $T_1$, which is between about 350° C. and about 500° C. and increasing the temperature of the wafers from $T_1$ to a second temperature, $T_2$, which is between about 500° C. and about 750° C., with the average rate of temperature increase from $T_1$ to $T_2$ being controlled such that (i) at each intermediate temperature, $T_{int}$, between $T_1$ and $T_2$, the single crystal silicon contains a population of oxygen precipitate nucleation clusters at least some of which were present a temperature which is less than $T_{int}$ but greater than $T_1$ and which have increased in size through the addition of oxygen atoms, and (ii) after the temperature of the wafers is increased to $T_2$, the wafers have a density of oxygen precipitate nucleation centers such that upon being subjected to an oxygen precipitation heat treatment consisting essentially of annealing the wafers at 800° C. for four hours and then at 1000° C. for sixteen hours, the wafers in the set contain oxygen precipitates with the ratio of the maximum density to the minimum density of oxygen precipitates for the wafers in the set being no more than about 50.

15. The process of claim 14 wherein the density of oxygen precipitates for the wafers in the set upon being subjected to the oxygen precipitation heat treatment is between about $10^7$ and about $10^{11}$ precipitates/cm$^3$.

16. The process of claim 14 wherein the difference between the maximum and the minimum concentration in the range of oxygen concentrations for the wafers in the set is at least $7.5 \times 10^{16}$ atoms/cm$^3$.

17. The process of claim 14 wherein the difference between the maximum and the minimum concentration in the range of oxygen concentrations for the wafers in the set is at least $1 \times 10^{17}$ atoms/cm$^3$.

18. The process of claim 14 wherein said process is terminated at a point in time when the oxygen precipitate nucleation centers formed during the process are capable of being dissolved by heat-treating the wafers at a temperature not in excess of about 1150° C.

19. The process of claim 14 wherein said wafers are not heat-treated to form a denuded before being caused to achieve the first temperature, $T_1$.

20. The process of claim 14 wherein average rate of temperature increase from $T_1$ to $T_2$ is less than 10° C. per minute.

21. The process of claim 14 wherein the ratio of the maximum density to the minimum density of oxygen precipitates for the wafers in the set is no more than about 30.

22. The process of claim 14 wherein the ratio of the maximum density to the minimum density of oxygen precipitates for the wafers in the set is no more than about 20.

23. The process of claim 14 wherein the ratio of the maximum density to the minimum density of oxygen precipitates for the wafers in the set is no more than about 10.

24. The process of claim 14 wherein the ratio of the maximum density to the minimum density of oxygen precipitates for the wafers in the set is no more than about 5.

25. A set of single crystal silicon wafers assembled in a wafer cassette, boat or other wafer carrier which have not been selected for inclusion in the set on the basis of oxygen concentration or thermal history, each of the single crystal silicon wafers in the set having a substantially uniform oxygen concentration at distances greater than 5 microns from the surface of the wafers with the difference between the maximum and the minimum concentration of oxygen concentration for the wafers in the set being at least $5 \times 10^{16}$ atoms/cm$^3$, each of the wafers in the set additionally having a concentration of oxygen precipitate nucleation centers such that upon being subjected to an oxygen precipitation heat treatment consisting essentially of annealing the wafers at 800° C. for four hours and then at 1000° C. for sixteen hours, the wafers in the set contain oxygen precipitates with the ratio of the maximum density to the minimum density of oxygen precipitates for the wafers in the set being no more than about 50.

26. The set of wafers of claim 25 wherein the set of wafers comprises at least about 25 wafers.

27. The set of wafers of claim 25 wherein the difference between the maximum and the minimum concentration in the range of oxygen concentrations for the wafers in the set is at least $7.5 \times 10^{16}$ atoms/cm$^3$.

28. The set of wafers of claim 27 wherein the ratio of the maximum density to the minimum density of oxygen precipitates for the wafers in the set is no more than about 20.

29. The set of wafers of claim 25 wherein the ratio of the maximum density to the minimum density of oxygen precipitates for the wafers in the set is no more than about 20.

30. The set of wafers of claim 25 wherein the ratio of the maximum density to the minimum density of oxygen precipitates for the wafers in the set is no more than about 10.

31. The set of wafers of claim 25 wherein the ratio of the maximum density to the minimum density of oxygen precipitates for the wafers in the set is no more than about 5.

32. The set of wafers of claim 25 wherein the difference between the maximum and the minimum concentration in the range of oxygen concentrations for the wafers in the set is at least $1 \times 10^{17}$ atoms/cm$^3$.

33. The set of wafers of claim 32 wherein the ratio of the maximum density to the minimum density of oxygen precipitates for the wafers in the set is no more than about 20.

* * * * *